United States Patent
Hu et al.

(10) Patent No.: US 10,175,267 B2
(45) Date of Patent: Jan. 8, 2019

(54) CURRENT MEASUREMENT CIRCUIT FOR MEASURING CURRENT CONSUMPTION OF CIRCUIT SYSTEM

(71) Applicant: NOVATEK Microelectronics Corp., Hsin-Chu (TW)

(72) Inventors: Min-Hung Hu, Hsinchu (TW); Hsi-Ming Chen, Hsinchu (TW); Chao-Wei Su, Tainan (TW); Ying-Chieh Yen, Hsinchu (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 218 days.

(21) Appl. No.: 15/394,770

(22) Filed: Dec. 29, 2016

(65) Prior Publication Data
US 2018/0188292 A1 Jul. 5, 2018

(51) Int. Cl.
*G01R 15/14* (2006.01)
*G01R 19/00* (2006.01)

(52) U.S. Cl.
CPC ....... *G01R 15/146* (2013.01); *G01R 19/0092* (2013.01)

(58) Field of Classification Search
CPC .................. G01R 15/146; G01R 19/0092
USPC .................. 324/123 R, 76.11, 73.1
See application file for complete search history.

(56) References Cited

U.S. PATENT DOCUMENTS

| | | | | |
|---|---|---|---|---|
| 6,617,972 B2 * | 9/2003 | Takarada | ........... | G08B 21/0484 324/538 |
| 8,779,729 B2 * | 7/2014 | Shiraishi | ........... | G01R 31/3606 320/155 |
| 2012/0098518 A1 * | 4/2012 | Unagami | ........... | G01R 22/066 324/74 |

* cited by examiner

*Primary Examiner* — Giovanni Astacio-Oquendo
(74) *Attorney, Agent, or Firm* — Winston Hsu

(57) ABSTRACT

A current measurement circuit for measuring a current consumption of a circuit system includes a plurality of current measurement units and a current-to-voltage (I-V) converter. Each of the current measurement units includes an impedance unit and a voltage-to-current (V-I) converter. The impedance unit includes a first terminal and a second terminal. The V-I converter, coupled to the first terminal and the second terminal of the impedance unit, includes an output terminal and an operational transconductance amplifier (OTA). The plurality of output terminals of the plurality of V-I converters of the plurality of current measurement units are coupled to a first node. The I-V converter is coupled to the first node.

17 Claims, 6 Drawing Sheets

CURRENT MEASUREMENT CIRCUIT FOR MEASURING CURRENT CONSUMPTION OF CIRCUIT SYSTEM

BACKGROUND OF THE INVENTION

1. Field of the Invention

The present invention relates to a current measurement circuit utilized in a circuit system, and more particularly, to a current measurement circuit for measuring a current consumption of a circuit system.

2. Description of the Prior Art

In the semiconductor industry, power consumption is an important issue to be considered and handled in any analog and/or digital circuits. Several circuit design techniques are developed to find out the power consumption by measuring currents. For example, a built-in self-test (BIST) circuit is applied to an integrated circuit (IC) as a circuit system to measure the current consumption of the IC, in order to determine whether the power consumption of the IC conforms to a specification. The obtained current information may further be applied to adjust the performance of the IC. For example, a DC-DC converter utilizes the obtained current value as a feedback signal to ensure the stability of the circuit system.

Please refer to FIG. 1, which is a schematic diagram of a conventional current sense amplifier 10. The current sense amplifier includes a sensing resistor $R_{SEN}$, four resistors R1-R4, an operational amplifier 100. An analog to digital converter (ADC) 102, which is not included in the current sense amplifier 10, is also illustrated in FIG. 1. The input terminals of the operational amplifier 100 are coupled between the resistors R1 and R2 and between the resistors R3 and R4, respectively. The output terminal of the operational amplifier 100 is coupled to the ADC 102. The resistors R1-R4 have the same resistance. The current sense amplifier 10 is utilized for sensing a current $I_{DET}$ flowing through the sensing resistor $R_{SEN}$ from a power source having a voltage $V_{DET}$. In detail, a voltage difference $\Delta V_{DET}$ across the sensing resistor $R_{SEN}$ is generated when the current $I_{DET}$ flows through the sensing resistor $R_{SEN}$. Due to the feedback loop gain of the operational amplifier 100, the two input terminals of the operational amplifier 100 are virtually short-circuited and the voltages of the input terminals of the operational amplifier 100 are obtained as follows:

$$V_{IN+} = V_{IN-} = \frac{V_{DET}}{2}.$$

With the resistance of the resistors R1-R4 equal to R, the voltage of the negative input terminal of the operational amplifier 100 equals:

$$V_{IN-} = \frac{V_{DET}}{2} = V_{DET} - I_{RES} \times R - \Delta V_{DET} = V_{OUT} + I_{RES} \times R;$$

wherein $I_{RES}$ stands for the current flowing through the resistors R1 and R2, and $V_{OUT}$ stands for the output voltage of the operational amplifier 100.

The above equation may be simplified to $|V_{OUT}=\Delta V_{DET}$. Therefore, the voltage difference $\Delta V_{DET}$ is transferred to the output terminal of the operational amplifier 100 by the circuit structure of the current sense amplifier 10. The ADC 102 then digitalizes the information of the voltage difference $\Delta V_{DET}$ to obtain a digital signal which indicates the current $I_{DET}$ measured by the current sense amplifier 10; that is, $$I_{DET} = \frac{\Delta V_{DET}}{R_{SEN}} = \frac{V_{OUT}}{R_{SEN}}.$$

Common current sense amplifiers are implemented based on the circuit structure shown in FIG. 1. The common features include a sensing resistor $R_{SEN}$ for converting the current $I_{DET}$ flowing through the sensing resistor $R_{SEN}$ into the voltage difference $\Delta V_{DET}$. An operational amplifier such as the operational amplifier 100 then converts the voltage difference $\Delta V_{DET}$ into a recognizable output voltage $V_{OUT}$, which is further converted to the digital signal via an ADC such as the ADC 102.

For a system on chip (SOC), larger chip size of the SOC causes that the metal routing lines have a long length, while the width remains at a specific level. Since the impedance of metal wires is proportional to the metal length and inversely proportional to the metal width, there may exist considerable impedance on the routing lines. For example, FIG. 2A illustrates an SOC 20 receiving power from a power source having a voltage $V_{DET}$, where a corresponding current $I_{DET}$ is received via a power pad. However, since the SOC 20 receives power via only one power pad, the IR drop due to a long routing line having a plurality of parasitic resistances $R_{METAL}$ causes that the nodes in the circuit of the SOC 20 far from the power pad may not receive enough voltage $V_{DET}$. Thus, it is preferable to place more input power pads spreading over the SOC 20, so that every position in the circuit of the SOC 20 may receive enough voltage $V_{DET}$, as shown in FIG. 2B.

If the current sense amplifier 10 shown in FIG. 1 is applied to detect the current consumption $I_{DET}$ received by the SOC 20 shown in FIG. 2B, for each power pad one respective current sense amplifier and one respective DAC should be coupled to the power pad, to detect the currents $I_{D,1}, I_{D,2}, I_{D,3} \ldots$, respectively. The digital signals of the ADCs are summed to obtain the information of the entire current consumption $I_{DET}$. However, this implementation requires a great number of ADCs and digital signal processing circuits, which require a higher circuit cost. In addition, the obtained current information may possess a larger error due to the summation of quantization errors of the ADCs. Thus, there is a need for improvement over the prior art.

SUMMARY OF THE INVENTION

It is therefore an objective of the present invention to provide a current measurement circuit, which is capable of measuring a current consumption of a circuit system, in order to realize a satisfactory current measurement performance.

An embodiment of the present invention discloses a current measurement circuit, for measuring a current consumption of a circuit system. The current measurement circuit comprises a plurality of current measurement units and a current-to-voltage (I-V) converter. Each of the current measurement units comprises an impedance unit and a voltage-to-current (V-I) converter. The impedance unit comprises a first terminal and a second terminal. The V-I converter, coupled to the first terminal and the second terminal of the impedance unit, comprises an output terminal and an operational transconductance amplifier (OTA). A plurality of output terminals of the plurality of V-I converters of the plurality of current measurement units are coupled to a first node. The I-V converter is coupled to the first node.

These and other objectives of the present invention will no doubt become obvious to those of ordinary skill in the art after reading the following detailed description of the preferred embodiment that is illustrated in the various figures and drawings.

DETAILED DESCRIPTION

In order to realize a satisfactory current measurement performance in a larger circuit system such as a system on chip (SOC) having multiple input power pads, the detected current is preferably converted into a replica current to be collected and summed with other replica currents.

Figure 1:
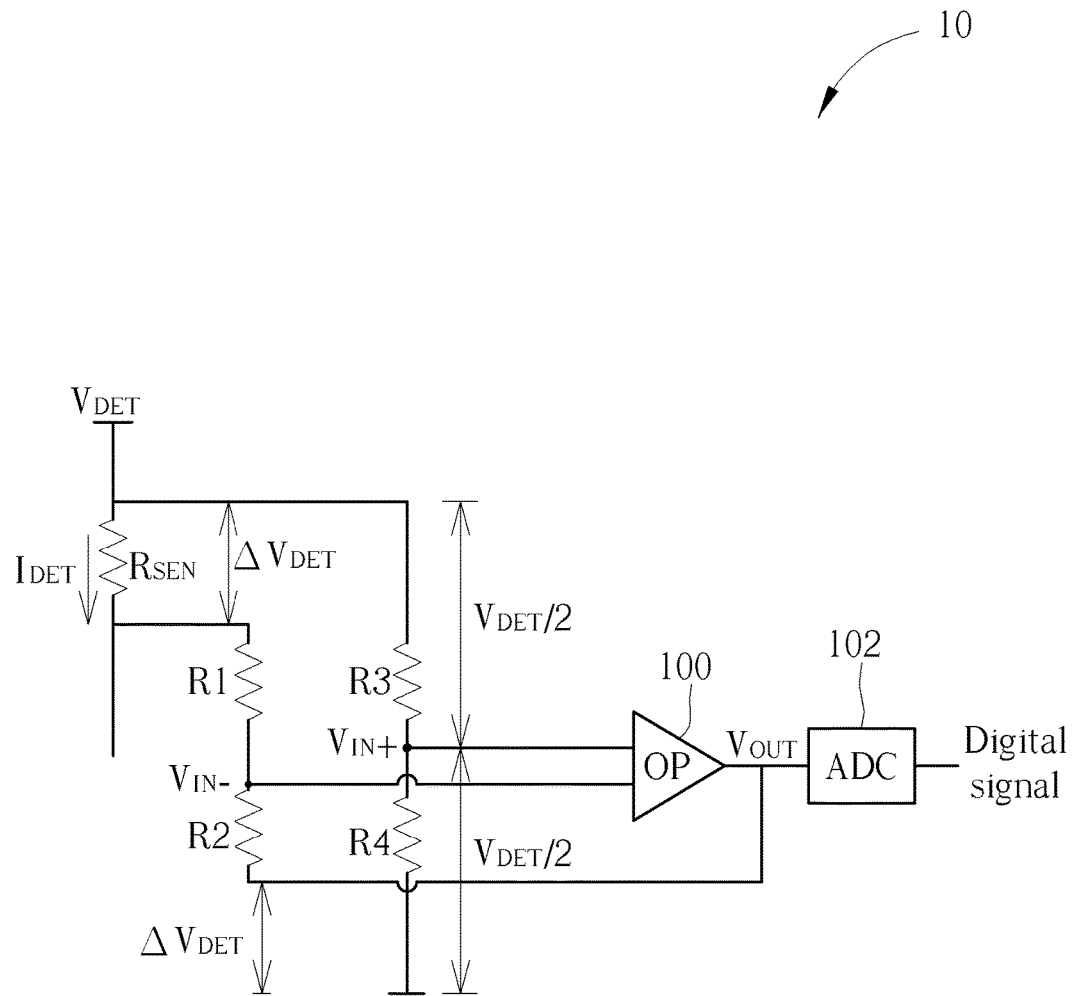
FIG. 1 is a schematic diagram of a conventional current sense amplifier.
Figure 2B:
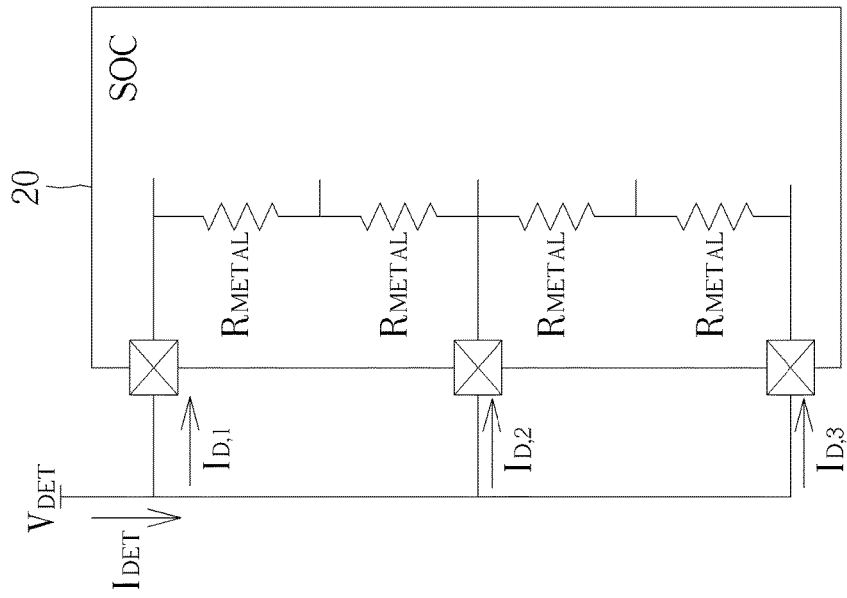
FIG. 2B is a schematic diagram of an SOC receiving power from a power source via multiple input power pads spreading over the SOC.
Figure 2A:
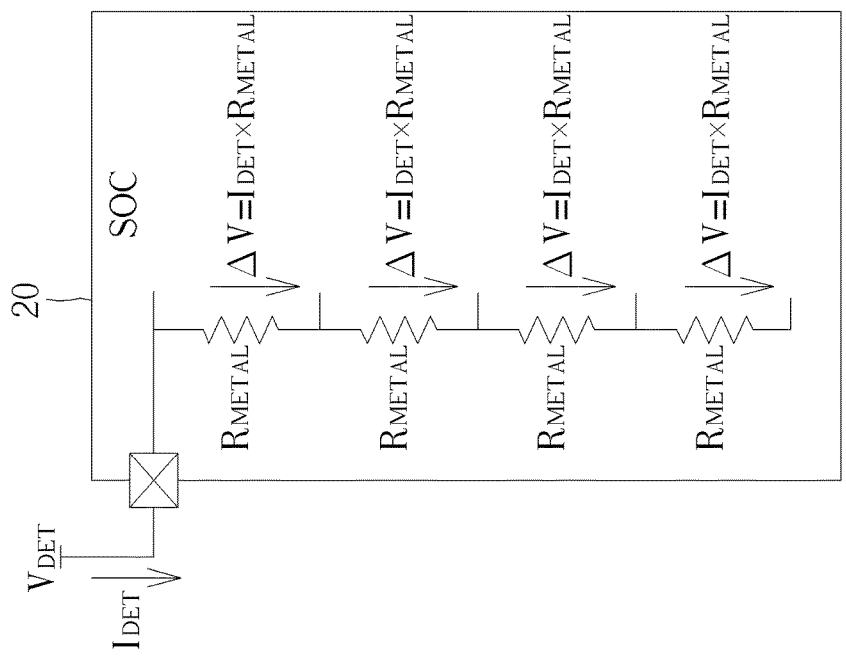
FIG. 2A is a schematic diagram of an SOC receiving power from a power source.
Figure 3:
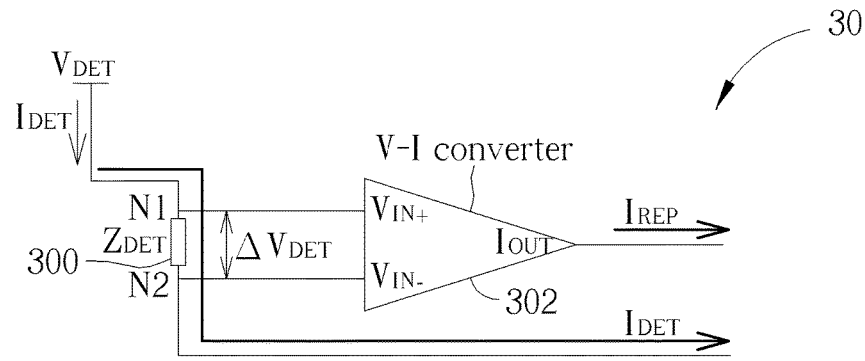
FIG. 3 is a schematic diagram of a current measurement unit according to an embodiment of the present invention.

Please refer to FIG. 3, which is a schematic diagram of a current measurement unit 30 according to an embodiment of the present invention. The current measurement unit 30 includes an impedance unit 300 and a voltage-to-current (V-I) converter 302. The impedance unit 300, which has a first terminal N1 and a second terminal N2, is utilized for converting a current $I_{DET}$ flowing through the impedance unit 300 into a voltage difference $\Delta V_{DET}$ across the first terminal N1 and the second terminal N2 of the impedance unit 300. The V-I converter 302 includes an operational transconductance amplifier (OTA). The input terminals $V_{IN+}$ and $V_{IN-}$ of the V-I converter 302 are coupled to the first terminal N1 and the second terminal N2 of the impedance unit 300, respectively. The output terminal $I_{OUT}$ of the V-I converter 302 may output a replica current $I_{REP}$ corresponding to the current $I_{DET}$. In other words, the V-I converter 302 may convert the voltage difference $\Delta V_{DET}$ across the first terminal N1 and the second terminal N2 of the impedance unit 300 into the replica current $I_{REP}$.

It should be noted that the replica current $I_{REP}$ may be controlled to be K times the current $I_{DET}$ flowing through the impedance unit 300, $I_{REP}=K\lambda I_{DET}$, wherein K may equal the impedance of the impedance unit 300 multiplied by the transconductance of the V-I converter 302; that is, $K=Z_{DET}\times$ $G_m$. With a proper design of the impedance of the impedance unit 300 ($Z_{DET}$) and the transconductance of the V-I converter 302 ($G_m$), the relation between the current $I_{DET}$ to be measured and the replica current $I_{REP}$ may be well controlled.

Figure 4:
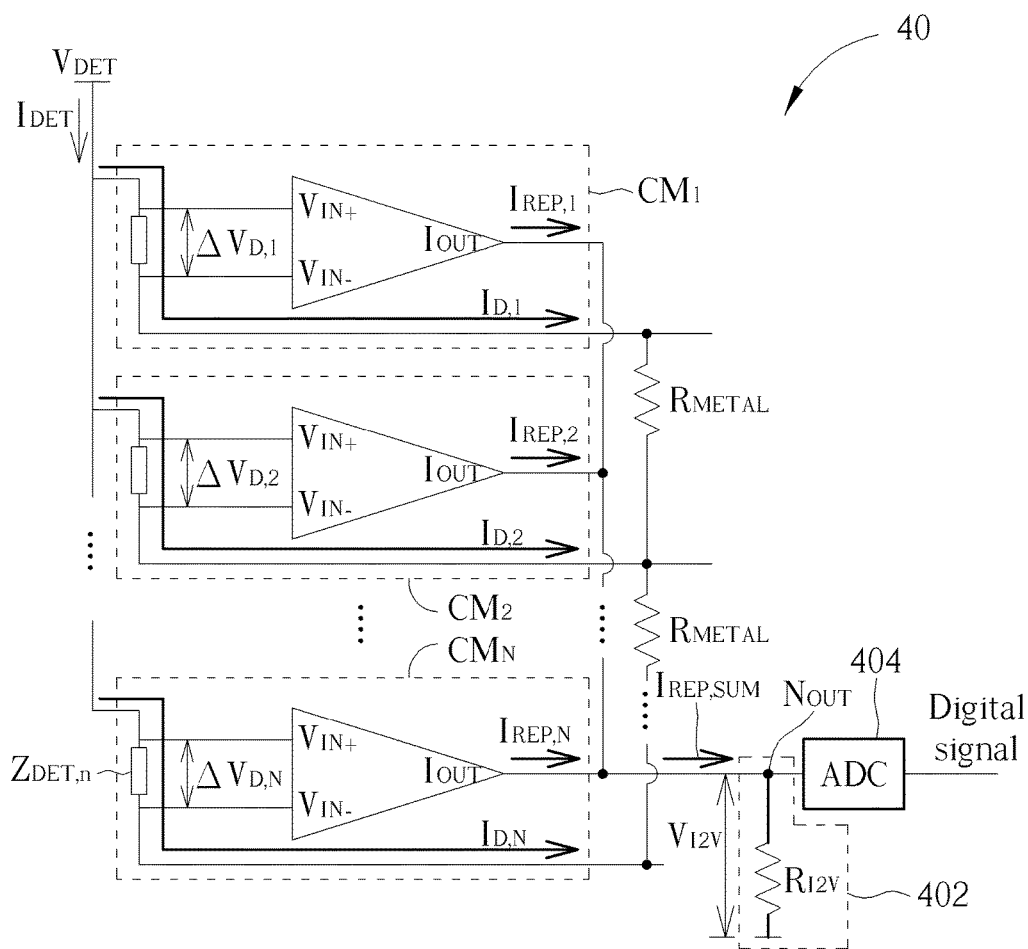
FIG. 4 is a schematic diagram of a current measurement circuit according to an embodiment of the present invention.

Please refer to FIG. 4, which is a schematic diagram of a current measurement circuit 40 according to an embodiment of the present invention. The current measurement circuit 40 includes N current measurement units $CM_1$-$CM_N$, a current-to-voltage (I-V) converter 402 and an analog to digital converter (ADC) 404. Each of the current measurement units $CM_1$-$CM_N$ has a structure similar to the structure of the current measurement unit 30 shown in FIG. 3; that is, each of the current measurement units $CM_1$-$CM_N$ includes an impedance unit and a V-I converter. The output terminals $I_{OUT}$ of the V-I converters of the current measurement units $CM_1$-$CM_N$ are coupled to an output node $N_{OUT}$. The I-V converter 402 is coupled to the output node $N_{OUT}$, and the ADC 404 is coupled to the I-V converter 402. $R_{METAL}$ means the parasitic resistance of a part of a metal routing line.

In detail, the current $I_{DET}$ to be measured is separated into N parts $I_{D,1}$-$I_{D,N}$. With the implementations and operations as the current measurement unit 30 illustrated in FIG. 3, the impedance units may convert the currents $I_{D,1}$-$I_{D,N}$ into voltage differences $\Delta V_{D,1}$-$\Delta V_{D,N}$, and the current measurement units $CM_1$-$CM_N$ may generate replica currents $I_{REP,1}$-$I_{REP,N}$ based on the voltage differences $\Delta V_{D,1}$-$\Delta V_{D,N}$, respectively. Subsequently, the replica currents $I_{REP,1}$-$I_{REP,N}$ flow to the output node $N_{OUT}$ and are summed up at the output node $N_{OUT}$ to generate a summation current $I_{REP,SUM}$. The I-V converter 402 then converts the summation current $I_{REP,SUM}$ into an output voltage $V_{I2V}$. In an embodiment, the I-V converter 402 may include a resistor $R_{I2V}$, which has two terminals respectively coupled to the output node $N_{OUT}$ and the ground plane. The resistor $R_{I2V}$ is able to convert the summation current $I_{REP,SUM}$ flowing through the output node $N_{OUT}$ into the output voltage $V_{I2V}$. Subsequently, the ADC 404 converts the output voltage $V_{I2V}$ at the output node $N_{OUT}$ into a digital signal, and the digital signal indicates the current $I_{DET}$ to be measured.

As mentioned above, the relation between the measured current and the corresponding replica current may be well controlled with a proper design of the impedance of the impedance unit ($Z_{DET,n}$) and the transconductance of the V-I converter ($G_{m,n}$). Therefore, in each of the current measurement units $CM_1$-$CM_N$ of the current measurement circuit 40, the generated replica current $I_{REP,n}$ may be controlled to be K times the current $I_{D,n}$; that is, $I_{REP,n}=K\times I_{D,n}$, where n=1~N. With well-controlled impedance of the impedance units and well-controlled transconductance of the V-I converters, the ratio K for each current measurement unit $CM_1$-$CM_N$ may be controlled to be the same. Therefore, the summation current $I_{REP,SUM}$ may be equivalent to K times the current $I_{DET}$ to be measured; that is, $$I_{REP,SUM} = \sum_{n=1}^{N} I_{REP,n} = \sum_{n=1}^{N} [K \times I_{D,n}] = K \times I_{DET}.$$

In an embodiment, the current $I_{DET}$ to be measured may be the current consumption of a circuit system, and the circuit system may be a driving circuit of a display device or an SOC. Note that the driving circuit of the display device may include a gate driving circuit and a source driving circuit integrated within an SOC driver. The driving circuit (SOC) for the display device may be multiple input power pads spreading over the peripheral region of the driving circuit to receive respective currents from an external power supply.

Figure 5:
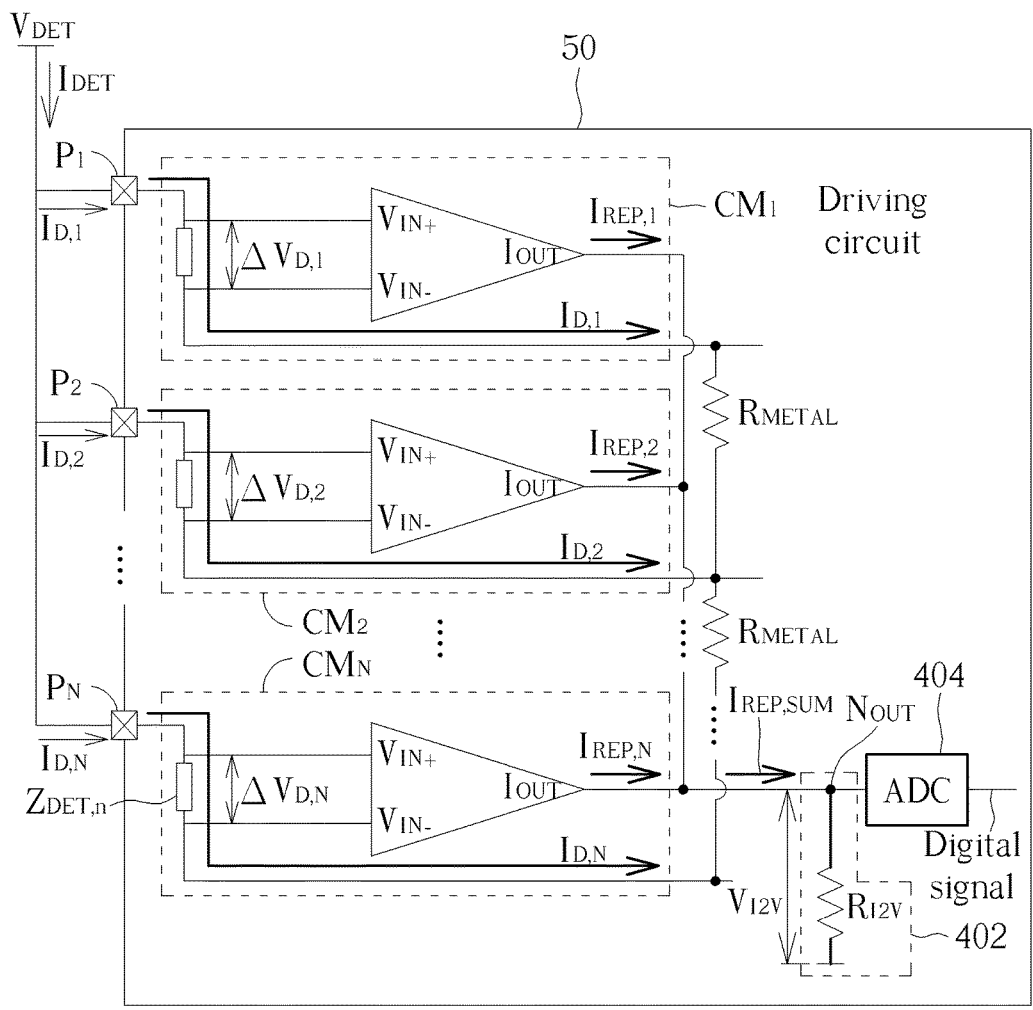
FIG. 5 is a schematic diagram of a current measurement circuit implemented in a driving circuit.

Please refer to FIG. 5, which is a schematic diagram of a current measurement circuit implemented in a driving circuit 50. The structure of the current measurement circuit shown in FIG. 5 is the same as the structure of the current measurement circuit 40 shown in FIG. 4, where the signals and elements having similar functions are denoted by the same symbols. The driving circuit 50 includes N input power pads $P_1$-$P_N$, so there are N current measurement units $CM_1$-$CM_N$ included in the current measurement circuit. Each of the current measurement units $CM_1$-$CM_N$ is coupled to a respective one of the N input power pads $P_1$-$P_N$, for measuring the currents received from the N input power pads $P_1$-$P_N$, respectively. In detail, the current $I_D$=flows into the driving circuit 50 via the power pads $P_1$-$P_N$. Each part $(I_{D,1}, I_{D,2}, I_{D,3} \ldots, I_{D,N})$ of the current $I_{DET}$ is respectively converted into the replica currents $I_{REP,1}$-$I_{REP,N}$ by a respective one of the current measurement units $CM_1$-$CM_N$. The replica currents $I_{REP,1}$-$I_{REP,N}$ are summed up at the output node $N_{OUT}$ to be the summation current $I_{REP,SUM}$. As a result, the I-V converter 402 may generate the output voltage $V_{I2V}$ based on the summation current $I_{REP,SUM}$ and the ADC 404 may generate the digital signal based on the output voltage $V_{I2V}$.

According to embodiments of the present invention, only one ADC is required, which reduces the circuit area and cost. The replica currents $I_{REP,1}$-$I_{REP,N}$ may propagate through a long distance of routing lines without large distortion or degradation, even if there is large impedance $R_{METAL}$ of the metal routing lines as the current paths. Therefore, the digital signal indicating the current consumption of the circuit system obtained from the summation current may have a precise value. Since the currents $I_{D,1}$-$I_{D,N}$ are measured after being converted into the replica currents $T_{REP,1}$-$I_{REP,N}$ the measurements and summation of the replica currents $I_{REP,1}$-$I_{REP,N}$ may not influence operations of the original currents $I_{D,1}$-$I_{D,N}$.

Please note that the impedance unit may be realized by any method, as long as the impedance of the impedance unit allows a received current to be converted into a voltage difference one-on-one. The current-to-voltage conversion may be a linear or nonlinear conversion. The linear conversion may be realized by a passive element such as a resistor, and the nonlinear conversion may be realized by an active element such as a MOS transistor. Several implementations of the impedance unit are illustrated as follows.

Figure 6A:
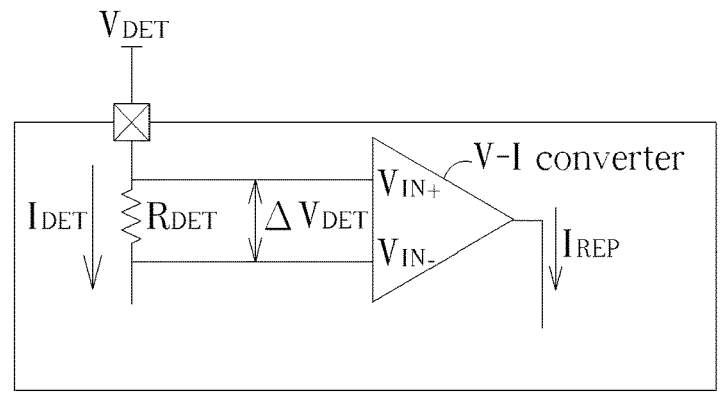
FIGS. 6A-6D are schematic diagrams of implementations of the impedance unit according to embodiments of the present invention.

Please refer to FIGS. 6A-6D, which are schematic diagrams of implementations of the impedance unit according to embodiments of the present invention. As shown in FIG. 6A, the impedance unit includes a resistor $R_{DET}$ for converting the current $I_{DET}$ flowing thought the resistor $R_{DET}$ into the voltage difference $\Delta V_{DET}$ across the resistor $R_{DET}$. Note that the resistor $R_{DET}$ may generate a voltage drop on the input power, and thus the voltage of power received by the circuit system may be degraded due to the voltage drop.

Figure 6B:
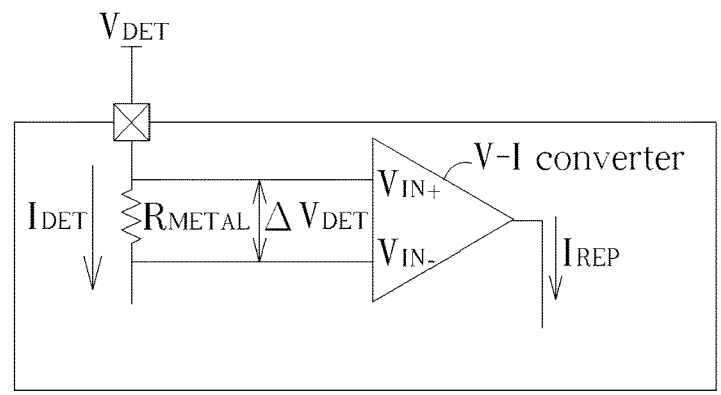

In order to prevent the voltage degradation, the impedance of the impedance unit may be realized with the impedance already existing on the path of the current $I_{DET}$. As shown in FIG. 6B, the impedance unit includes a predetermined part of metal routing line in the circuit system, where the predetermined part of metal routing line has a parasitic resistance $R_{METAL}$. The parasitic resistance $R_{METAL}$ is utilized as the impedance for converting the current $I_{DET}$ into the voltage difference $\Delta V_{DET}$. Since the parasitic resistance of a unit of metal routing line may be estimated and controlled in the parameters of the semiconductor fabrication process, the parasitic resistance $R_{METAL}$ may be determined by the length and width of the predetermined part of metal routing line included in the impedance unit.

Figure 6C:
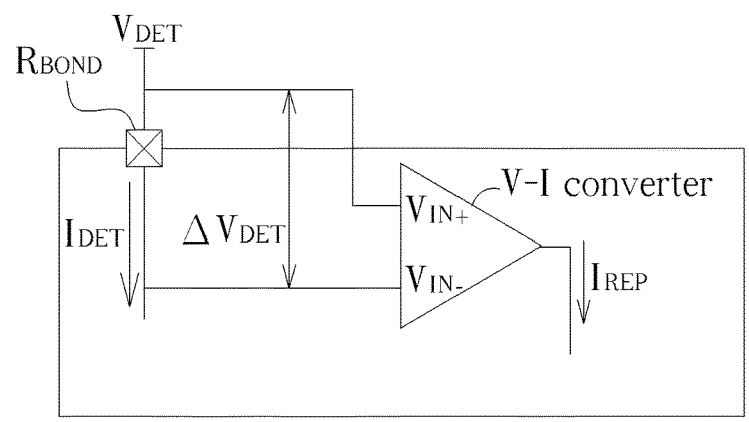

In another embodiment, the impedance unit may include a bonding unit utilized for bonding the semiconductor chip of the circuit system to a substrate, as shown in FIG. 6C. In such a situation, the parasitic resistance $R_{BOND}$ of a bonding wire and/or a bump is utilized as the impedance for converting the current $I_{DET}$ into the voltage difference $\Delta V_{DET}$. The parasitic resistance $R_{BOND}$ of the bonding wire may be specified within a range since the voltage received by the semiconductor chip is equivalent to the voltage $V_{DET}$ of the power source subtracting the voltage drop across the bonding unit. In such a situation, the parasitic resistance $R_{BOND}$ should be limited to the specified range, in order to maintain the voltage of power received by the semiconductor chip at a specific level. Note that the input terminal $V_{IN+}$ of the V-I converter has to be connected to the power source via another bonding unit. The current flowing through this bonding unit to the input terminal $V_{IN+}$ is far less than the current $I_{DET}$, and thus the voltage drop generated by this bonding unit may be omitted when the current consumption detection of the circuit system is performed.

Figure 6D:
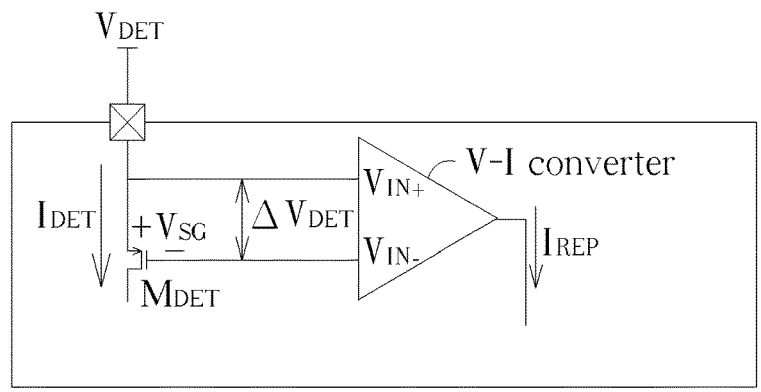

In a further embodiment, the impedance unit may include a transistor, where the impedance of the impedance unit is the reciprocal of the transconductance of the transistor. As shown in FIG. 6D, when a PMOS transistor $M_{DET}$ is utilized to generate the impedance of the impedance unit, the current-to-voltage conversion may be a one-on-one conversion which follows the current-voltage characteristic of a PMOS, as the following formula:

$$I_{DET}=K_P(V_{SG}-V_{TH})^2;$$

where $K_P$ stands for the fabrication process parameter of the PMOS, $V_{SG}$ stands for the source-to-gate voltage of the PMOS transistor $M_{DET}$, and $V_{TH}$ stands for the threshold voltage of the PMOS transistor $M_{DET}$. The transconductance $G_{m,DET}$ of the PMOS transistor $M_{DET}$ may be calculated as follows:

$$G_{m,DET} = \frac{\partial I_{DET}}{\partial V_{SG}} = 2K_P(V_{SG} - V_{TH});$$

and the equivalent impedance $Z_{DET}$ of the PMOS transistor $M_{DET}$ may be obtained as follows:

$$Z_{DET} = \frac{1}{G_{m,DET}} = \frac{1}{2K_P(V_{SG} - V_{TH})}.$$

As can be seen from the above formulas, the impedance of the impedance unit may be equivalent to the reciprocal of the transconductance $G_{m,DET}$ of the PMOS transistor $M_{DET}$; hence, the current-voltage characteristic of the PMOS transistor $M_{DET}$ may be utilized to realize the impedance unit.

Figure 7:
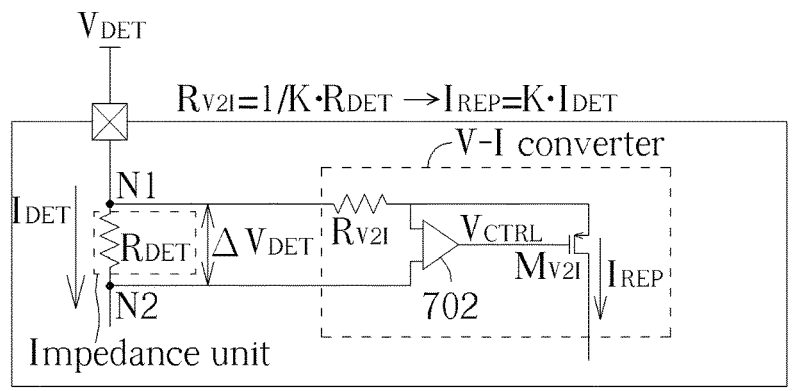
FIG. 7 is a schematic diagram of an implementation of the current measurement unit with linear current-voltage characteristic in the impedance unit.

Please refer to FIG. 7, which is a schematic diagram of an implementation of the current measurement unit with linear current-voltage characteristic in the impedance unit. As shown in FIG. 7, the impedance unit is realized by using a detecting resistor $R_{DET}$, and the V-I converter includes a voltage-to-current (V-I) resistor $R_{V2I}$, an OTA 702 and a V-I transistor $M_{V2I}$. The detecting resistor $R_{DET}$ may convert the current $I_{DET}$ flowing through the detecting resistor $R_{DET}$ into a voltage difference $\Delta V_{DET}$ across the first terminal N1 and the second terminal N2 of the detecting resistor $R_{DET}$. The OTA 702 then generates a control signal $\backslash I_{CTRL}$ according to the voltage difference $\Delta V_{DET}$, to control the V-I transistor $M_{V2I}$ to output the replica current $I_{REP}$.

In detail, a terminal of the V-I resistor $R_{V2I}$ is coupled to the first terminal N1 of the detecting resistor $R_{DET}$, and another terminal of the V-I resistor $R_{V2I}$ is coupled to a first input terminal of the OTA 702. A second input terminal of the OTA 702 is coupled to the second terminal N2 of the detecting resistor $R_{DET}$, and the output terminal of the OTA 702 is coupled to the gate terminal of the V-I transistor $M_{V2I}$. In this implementation, the replica current $I_{REP}$ equals to K times the current $I_{DET}$ flowing through the detecting resistor $R_{DET}$, and the resistance of the V-I resistor $R_{V2I}$ may equal the resistance of the detecting resistor $R_{DET}$ multiplied by 1/K, $R_{V2I}=1/K) R_{DET}$, where the resistance of the detecting resistor $R_{DET}$ is regarded as the impedance of the impedance unit. The control signal $V_{CTRL}$ outputted from the OTA 702 controls the V-I transistor $M_{V2I}$ to output the replica current $I_{REP}$. The transconductance $G_m$ of the V-I converter and the replica current $I_{REP}$ may be presented as follows:

$$G_m = \frac{I_{REP}}{\Delta V_{DET}} = \frac{1}{R_{V2I}} = \frac{K}{R_{DET}};$$

$$I_{REP} = I_{DET} \cdot Z_{DET} \cdot G_m = I_{DET} \cdot R_{DET} \cdot \frac{1}{R_{V2I}} = I_{DET} \cdot R_{DET} \cdot \frac{K}{R_{DET}} = K \cdot I_{DET}.$$

Figure 8:
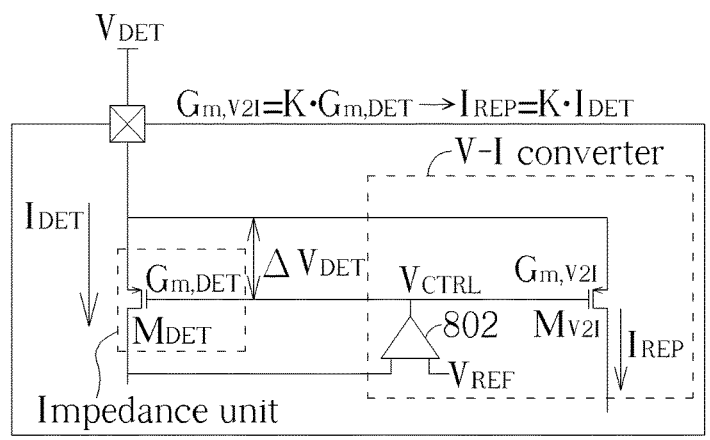
FIG. 8 is a schematic diagram of an implementation of the current measurement unit with nonlinear current-voltage characteristic in the impedance unit.

Please refer to FIG. 8, which is a schematic diagram of an implementation of the current measurement unit with non-linear current-voltage characteristic in the impedance unit. As shown in FIG. 8, the impedance unit is realized by using a detecting transistor $M_{DET}$, and the impedance of the impedance unit may equals the reciprocal of the transconductance $G_{m,DET}$ of the detecting transistor $M_{DET}$, $Z_{DET}=1/G_{m,DET}$. The V-I converter includes an OTA 802 and a V-I transistor $M_{V2I}$. The detecting transistor $M_{DET}$ may convert the current $I_{DET}$ flowing through the detecting transistor $M_{DET}$ into a voltage difference $\Delta V_{DET}$ across the source terminal and the gate terminal of the detecting transistor $M_{DET}$. The OTA 802 then generates a control signal $V_{CTRL}$ according to the voltage difference $\Delta V_{DET}$, to control the V-I transistor $M_{V2I}$ to output the replica current $I_{REP}$.

In detail, the gate terminal of the detecting transistor $M_{DET}$ is coupled to the output terminal of the OTA 802, the source terminal of the detecting transistor $M_{DET}$ is coupled to the source terminal of the V-I transistor $M_{V2I}$ and the power source, and the drain terminal of the detecting transistor $M_{DET}$ is coupled to a first input terminal of the OTA 802. A second input terminal of the OTA 802 receives a reference voltage $V_{REF}$, and the output terminal of the OTA 802 is further coupled to the gate terminal of the V-I transistor $M_{V2I}$. In this implementation, the replica current $I_{REP}$, equal to K times the current $I_{DET}$ flowing through the detecting transistor $M_{DET}$, and the transconductance $G_{m,V2I}$ of the V-I transistor $M_{V2I}$ may equal K times the transconductance $G_{m,DET}$ of the detecting transistor $M_{DET}$, $G_{m,V2I}=K \times G_{m,DET}$. In this case, the transconductance $G_{m,V2I}$ of the V-I transistor $M_{V2I}$ may be taken as the transconductance $G_m$ of the V-I converter. The value K may equal the impedance of the impedance unit multiplied by the transconductance $G_m$ of the V-I converter, $K=Z_{DET} \times G_m=(1/G_{m,DET}) \times G_m$. The control signal $V_{CTRL}$ outputted from the OTA 802 controls the V-I transistor $M_{V2I}$ to output the replica current $I_{REP}$. The transconductance $G_m$ of the V-I converter and the replica current $I_{REP}$, may be presented as follows:

$$G_m = K \cdot G_{m,DET};$$

$$I_{REP} = I_{DET} \cdot Z_{DET} \cdot G_m = I_{DET} \cdot \frac{1}{G_{m,DET}} \cdot K \cdot G_{m,DET} = K \cdot I_{DET}.$$

The reference voltage $V_{REF}$ may be configured to be slightly lower than the voltage $V_{DET}$ of the power source. Preferably, the reference voltage $V_{REF}$ may be as higher as possible, as long as the detecting transistor m DET is able to operate normally.

Please note that the present invention aims at providing a current measurement circuit for measuring a current consumption of a circuit system. Those skilled in the art may make modifications and alternations accordingly. For example, the circuit structures shown in FIG. 7 and FIG. 8 are two of various embodiments of the current measurement unit of the present invention. In other embodiments, the current measurement unit may be realized by other circuits. In the above embodiments, the V-I converter includes an OTA, and the OTA may generate a control signal based on the differential current generated by its input voltage signals. In other embodiments, the OTA may be replaced by an operational amplifier, or may be realized by other circuits. Also note that the ratio of the replica current and the measured current (i.e., the ratio K) may equal any real value. Preferably, the value of K may be as small as possible to reduce the values of the replica currents, in order to reduce additional power consumption when current measurement is performed.

To sum up, the present invention provides a current measurement circuit for measuring a current consumption of a circuit system. The current measurement circuit includes a plurality of current measurement units, each of which includes an impedance unit and a V-I converter. The current measurement circuit is preferably applied to a driving circuit of a display device or an SOC, where multiple input power pads are disposed for receiving power due to the long layout or large area of the circuit. Each of the current measurement units may be coupled to the corresponding one of the input power pads. The impedance unit may convert an input current from a corresponding power pad into a voltage difference, and the V-I converter may convert the voltage difference into a replica current. The replica currents generated by the current measurement units are then summed up to generate a summation current. Subsequently, an I-V converter converts the summation current into an output voltage, and an ADC generates a digital signal based on the output voltage. Therefore, the digital signal may indicate the current consumption of the circuit system. In such a situation, with a proper design of the impedance of the impedance unit and the transconductance of the V-I converter, the relation between the current to be measured and the replica current may be well controlled; hence, the relation between the entire current to be measured and the summation of the replica currents may also be well controlled. Since the replica currents may propagate through a long distance without large distortion or degradation, the digital signal indicating the current consumption of the circuit system obtained from the summation current may have a precise value.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A current measurement circuit, for measuring a current consumption of a circuit system, the current measurement circuit comprising:
    a plurality of current measurement units, each of the current measurement units comprising:
        an impedance unit, comprising a first terminal and a second terminal; and
        a voltage-to-current (V-I) converter, coupled to the first terminal and the second terminal of the impedance unit, comprising an output terminal and an operational transconductance amplifier (OTA), wherein a plurality of output terminals of the plurality of V-I converters of the plurality of current measurement units are coupled to a first node; and
    a current-to-voltage (I-V) converter, coupled to the first node.

2. The current measurement circuit of claim 1, wherein the impedance unit is utilized for converting a first current flowing through the impedance unit into a voltage difference across the first terminal and the second terminal of the impedance unit.

3. The current measurement circuit of claim 2, wherein the impedance unit comprises a resistor.

4. The current measurement circuit of claim 2, wherein the impedance unit comprises a connecting wire in the circuit system.

5. The current measurement circuit of claim 2, wherein the impedance unit comprises a bonding unit that is utilized for bonding a semiconductor chip of the circuit system to a substrate.

6. The current measurement circuit of claim 1, wherein the V-I converter is utilized for converting a voltage difference across the first terminal and the second terminal of the impedance unit into a replica current, and wherein the replica current is K times a first current flowing through the impedance unit, K being the impedance of the impedance unit multiplied by the transconductance of the V-I converter.

7. The current measurement circuit of claim 1, wherein the I-V converter is utilized for converting a current summation of a plurality of replica currents generated by the plurality of current measurement units into an output voltage, the current summation being equivalent to K times the current consumption of the circuit system to be measured, and K being the impedance of the impedance unit multiplied by the transconductance of the V-I converter.

8. The current measurement circuit of claim 7, wherein the I-V converter comprises a resistor, the resistor comprising two terminals respectively coupled to the first node and a ground plane.

9. The current measurement circuit of claim 1, further comprising:
    an analog to digital converter, coupled to the I-V converter, for converting an output voltage at the first node into a digital signal, wherein the digital signal indicates the current consumption of the circuit system to be measured.

10. The current measurement circuit of claim 1, wherein the circuit system is a driving circuit of a display device, and has a plurality of input pads for receiving respective currents from a power supply terminal.

11. The current measurement circuit of claim 10, wherein each of the plurality of current measurement units is coupled to a respective one of the plurality of input pads.

12. The current measurement circuit of claim 1, wherein the impedance unit comprises a transistor, and wherein the impedance of the impedance unit is the reciprocal of the transconductance of the transistor.

13. The current measurement circuit of claim 1, wherein the V-I converter further comprises a first MOS transistor having a gate terminal coupled to an output terminal of the OTA, and the OTA is utilized for generating a control signal according to a voltage difference across the first terminal and the second terminal of the impedance unit to control the first MOS transistor to output a replica current.

14. The current measurement circuit of claim 13, wherein the impedance unit has a linear current-voltage characteristic and the V-I converter further comprises a resistor comprising one terminal coupled to the first terminal of the impedance unit and the other terminal coupled to a first input terminal of the OTA, and wherein a second input terminal of the OTA is coupled to the second terminal of the impedance unit.

15. The current measurement circuit of claim 14, wherein a resistance of the resistor equals the impedance of the impedance unit multiplied by 1/K, the transconductance of the V-I converter equals the reciprocal of the impedance of the impedance unit multiplied by K, and the replica current is K times a first current flowing through the impedance unit.

16. The current measurement circuit of claim 13, wherein the impedance unit has a nonlinear current-voltage characteristic and comprises a second MOS transistor, the second MOS transistor having a gate terminal coupled to the output terminal of the OTA, a source terminal coupled to the first MOS transistor, and a drain terminal coupled to a first input terminal of the OTA, and wherein a second input terminal of the OTA is coupled to a reference voltage.

17. The current measurement circuit of claim 16, wherein the transconductance of the first MOS transistor is K times the transconductance of the second MOS transistor, the transconductance of the V-I converter equals K times the transconductance of the second MOS transistor, and the replica current is K times a first current flowing through the impedance unit, K being the impedance of the impedance unit multiplied by the transconductance of the V-I converter.

* * * * *